United States Patent [19]

Joormann et al.

[11] Patent Number: 4,609,582
[45] Date of Patent: Sep. 2, 1986

[54] DIELECTRIC GLASS IN MULTILAYER CIRCUITS AND THICK-FILM CIRCUITS COMPRISING SAME

[75] Inventors: Hendrik J. M. Joormann; Alois J. M. Van Gorp, both of Eindhoven, Netherlands

[73] Assignee: U.S. Philips Corporation, New York, N.Y.

[21] Appl. No.: 604,278

[22] Filed: Apr. 26, 1984

[30] Foreign Application Priority Data

May 6, 1983 [NL] Netherlands ............... 8301604

[51] Int. Cl.$^4$ .................. C03C 8/20; C03C 8/10; C03C 3/105
[52] U.S. Cl. ................. 428/138; 428/209; 428/210; 501/5; 501/17; 501/18; 501/22; 501/62; 501/74
[58] Field of Search ............ 501/5, 22, 62, 74, 17, 501/18; 428/131, 209, 138, 210, 142, 195

[56] References Cited

U.S. PATENT DOCUMENTS

| | | | |
|---|---|---|---|
| 3,493,405 | 2/1970 | Thomas | 501/74 |
| 3,849,097 | 11/1974 | Giffen et al. | 501/8 |
| 4,111,708 | 9/1978 | Flannery et al. | 501/62 |
| 4,319,215 | 3/1982 | Yamazaki et al. | 501/62 |
| 4,391,916 | 7/1983 | Nakagawa et al. | 501/62 |

*Primary Examiner*—Mark L. Bell
*Attorney, Agent, or Firm*—Paul R. Miller

[57] ABSTRACT

A dielectric glass and a glass ceramic obtained therefrom is provided for separating crossing conductors in multilayer thick-film circuits. The dielectric glass has a composition in mol. % between the limits of 10–25% ZnO, 7.5–25% PbO, 50–60% $SiO_2$, and 7.5–12.5% $Al_2O_3$. These compositions are particularly suitable for conductor patterns having silver because they are free from micropores.

9 Claims, No Drawings

DIELECTRIC GLASS IN MULTILAYER CIRCUITS AND THICK-FILM CIRCUITS COMPRISING SAME

The invention relates to a dielectric glass and a glass ceramic obtained therefrom for separating crossing conductors in multilayer circuits and to thick-film circuits comprising same.

A glass ceramic for such an application is described in CA-PS No. 842,293. This glass ceramic has a composition in percent by weight which is within the following limiting values:

| | |
|---|---|
| $SiO_2$ | 20–38 |
| PbO | 21–45 |
| $Al_2O_3$ | 1–25 |
| $TiO_2$ | 2–20 |
| BaO | 2–15 |
| ZnO | 0–25. |

A number of additions are permissible up to certain maxima, notably $PbF_2$, SrO, $ZrO_2$, $Ta_2O_5$, $WO_3$, CdO, $SnO_2$ and $Sb_2O_3$, in this compositions.

Upon quenching a molten composition within the abovementioned limits, a frit is obtained which after grinding can be used to make a silk-screening paste. After silk-screening, the paste is fired. Nucleation takes place succeeded by deposition of a crystalline phase on the nuclei. The resulting glass ceramic shows a low dielectric constant which prevents capacitive coupling between the mutually insulated circuits from taking place when used with an alternating voltage. It furthermore has low dielectric losses (a high Q-value), which prevents dielectric heating thereof, a small tendency to form pin holes and a small gas development upon firing.

Between 25 and 50% of the glass ceramic consists of a crystalline phase. It has been found that with a higher content of crystalline phase the possibility of porosity of the glass ceramic becomes larger.

Known conductor pastes are on the basis of gold as a material for the conductor.

In the experiments which have led to the present invention, it has been found that the known glass ceramics show micropores. These micropores are generally harmless; only when silver-containing conductor pastes, for example AgPd are used, do the micropores cause silver migration in a moisture test under electric load, as a result of which the insulation resistance becomes permanently low.

The invention provides a glass and a glass ceramic obtained therefrom which does not exhibit the said disadvantages and can be used excellently in multilayer circuits in which silver-containing conductor pastes are used.

It is characterized in that it comprises a composition in mol.% within the following limiting values:

| | |
|---|---|
| ZnO | 10–25 |
| PbO | 7.5–25 |
| $SiO_2$ | 50–60 |
| $Al_2O_3$ | 7.5–12.5 |

This glass, which may comprise compatible contaminations below admissible maximum values, is processed to a paste in known manner. The paste is processed in a multilayer circuit by means of a silk-screening process. The ultimately obtained multilayer circuit is fired at a temperature from 840°–900° C. in an overall time duration of 30 to 60 minutes. The glasses according to the invention have a softening temperature (i.e. the temperature at which the viscosity $\eta = 10^{7.65}$ poises) between 720°–800° C., which is 50°–180° C. below the firing temperature. This is particularly favourable because at the firing temperature the glass is then sufficiently fluid for the pores to close. It is also important that the crystallization behaviour of the glass during the thermal processes to be considered is such that the resulting glass ceramic contains from 10 to 20% by weight of a crystalline phase. The temperature at which crystallization starts must be in the temperature range from approximately 750°–800° C. The crystalline phases occurring are $Zn_2SiO_4$, $PbAlSi_2O_8$ and $Zn(AlO_2)_2$. When the crystallization would start only at higher temperature, then the danger exists that the conductors sag into the layer of glasses and crack locally, because the glass has too low a viscosity. A content of crystalline phase from 10 to 20% by weight is sufficiently low to have a product which is free from continuous micropores. On the other hand the quantity of crystalline phase is sufficiently large to have, during firing sufficient rigidity to prevent the conductor paths from sagging into the layer of the glass ceramic material and as a result fracturing locally. As a matter of fact the material of the conductor paths sinters already from approximately 600° C. to form a rigid rather brittle assembly. Finally it is of advantage that gas bubbles, when they occur in the composition of the invention or are formed during firing, are extremely small and their tendency to grow is prevented.

A preferred range of compositions (in mol.%) which have softening temperatures between 750° and 800° C. is limited as follows:

| | |
|---|---|
| ZnO | 15–20 |
| PbO | 10–15 |
| $SiO_2$ | 50–60 and |
| $Al_2O_3$ | 7.5–12.5 |

At most 5% by weight of colour oxides, for example, cobalt oxide, nickel oxide, copper oxide, vanadium oxide, chromium oxide, etc., mixtures or aluminates of the oxides may be added to the compositions according to the invention. The oxide may be added to the glass and/or to the paste.

The conductor paths which after completion of the manufacture of the circuit are present on the glass ceramic according to the invention cannot be soldered. This is because during the manufacture of the circuit pattern, i.e. during firing, glass diffuses into the conductor layer. This is a disadvantage in a number of applications.

In a further elaboration of the composition according to the invention, this disadvantage can be mitigated by filling it with an oxide or an oxidic compound which is poorly soluble in the glass and the glass ceramic, respectively, in a finely-divided form and in a quantity from 20 to 40% by weight, all this dependent on the specific weight. Examples of such poorly soluble oxides or oxidic compounds are $ZrO_2$, zirconium aluminate, zirconium silicate and aluminium oxide. The material thus filled may be used as a dielectric separation layer but it may also be used as an intermediate layer on a non-filled layer. The filled layer is usually porous. In that case the combination with a non-filled layer is imperative in order to prevent silver migration. The conductor paths on such a filled layer can be soldered excellently. As a result of this, components can be directly provided on the circuit, which is of great advantage.

Another possibility to achieve this is the addition of an oxide, for example zinc oxide or magnesium oxide, which, although it dissolves in the glass in the first instance, then increases the quantity of crystalline phase. In this case also the combination with a layer of the undoped glass is as a rule necessary due to the occurring porosity.

An advantage of the glass compositions according to the invention is the absence of $B_2O_3$, $Na_2O$, $K_2O$ in a quantity which is larger than 1 mol.%, fluoride and, halides, sulphur compounds, phosphorus compounds, molybdenum oxide and tungsten oxide in a quantity which exceeds 0.1 mol.%. Alkali metal oxide and boric acid would adversely influence the crystallization behaviour. Moreover, the substances, which at the firing temperature are all more or less volatile, may harm the properties of other circuit components.

The manufacture of a multilayer circuit by means of the thick-film technology will now be described by way of example.

On a substrate usual for thick-film technology, for example, consisting of 96% aluminium oxide, a conductor pattern is provided by silk-screening by means of a paste on the basis of Ag—Pd, for example Pd23, Ag67, to which glass and $Bi_2O_3$ have been added in an overall quantity of 10% by weight. A pattern of the glass ceramic according to the invention is then provided thereon, also by means of silk-screening, and comprises apertures, termed "vias", which are used to make electrical connections between conductors.

For the manufacture of the glass powder of one of the six compositions in the Table below, a mixture of the oxides in question is melted, the melt is quenched and the resulting frit is ground to an average grain size of 2 μm. The powder is processed to a silk-screening paste by a three-roller machine by means of a solution of 4.5% by weight of ethyl cellulose in a mixture which consists of 23% by weight of butyl carbitol acetate, 13% by weight of dibutyl phthalate and 64% by weight of terpineol until the desired viscosity characteristic is obtained. The paste comprises 40% by volume of glass powder.

The insulating layer is provided in two steps, each with a layer thickness of 40–50 μm in the wet condition with intermediate drying and thereon, also by silk-screening, a second conductor pattern is provided on the basis of Ag—Pd in a thickness of 40–50 μm also measured in the wet state. After drying, a coating layer in a thickness of 40–50 μm of the same composition as the insulating layer is provided so as to prevent undesired interactions between the layers and the assembly is fired at a temperature between 840°–900° C. A densification to approximately 40% of the original thickness takes place. It is also possible during the manufacture of the multilayer circuit to perform intermediarily one or more firing operations instead of one firing operation when all the layers have been silk-screened and dried.

If the resulting multilayer circuit is subjected to a moisture test in air at a humidity of 95–98% and at a temperature of 45° C. under 30 V direct voltage, a life of at least 1000 hours is found.

In the Table hereinafter six compositions are recorded of which numbers 1 and 6 are at the edge of the above-limited composition range and the properties of which are just acceptable. The compositions 2 to 5 fall within the above limited range and meet the requirements imposed. In the Table are recorded the capacity per $mm^2$ at 1 MHz, the dissiliss factor (tan δ), the insulation resistance, which is higher (+) or lower (−) than the value $10^4 M\Omega$ and the silver migration which is sufficiently low (+) or too high (−) and the softening temperature (ST) in °C. The properties are measured using a 35 μm thick fired layer on a standard two-layer pattern. The content of crystalline phase is between 10 and 20% by weight in all of the samples.

The silver migration is observed by means of a standard pattern on which 104 cross-overs are present. The circuit is kept immersed in water under direct voltage for 4 hours. It is judged visually whether the silver migration is of a sufficiently low level (+): in that case there are at most 3 silver spots visible. If there are more, the silver migration is evaluated as being too large.

TABLE

| No | composition (mol. %) | | | | Composition (wt. %) | | | | Cap. pF/mm" | Tan δ (%) | R >$10^4 M\Omega$ | migr. | ST °C. |
| --- | --- | --- | --- | --- | --- | --- | --- | --- | --- | --- | --- | --- | --- |
| | ZnO | PbO | $Al_2O_3$ | $SiO_2$ | ZnO | PbO | $Al_2O_3$ | $SiO_2$ | | | | | |
| 1 | 25 | 7.5 | 7.5 | 60 | 25 | 21.7 | 9.3 | 44 | 2.5 | 1.1 | − | − | 810 |
| 2 | 25 | 10 | 10 | 55 | 23.7 | 26 | 12 | 38.3 | 2.4 | 0.7 | + | + | 790 |
| 3 | 20 | 15 | 10 | 55 | 18 | 36 | 10 | 36 | 2.8 | 0.6 | + | + | 770 |
| 4 | 17.5 | 17.5 | 12.5 | 52.5 | 14.5 | 40.5 | 13 | 32 | 3.4 | 0.55 | + | + | 765 |
| 5 | 15 | 20 | 10 | 55 | 12.2 | 44.6 | 10.2 | 33 | 3.5 | 0.7 | + | + | 750 |
| 6 | 10 | 25 | 10 | 55 | 7.5 | 52 | 9.5 | 31 | 3.7 | 0.8 | − | + | 720 |

What is claimed is:

1. A dielectric glass for separating crossing conductors in multilayer circuits, said glass having a composition consisting essentially of 10–25 mol.% ZnO, 7.5–25 mol.% PbO, 50–60 mol.% $SiO_2$, and 7.5–12.5 mol.% $Al_2O_3$ together with 0–5% by weight of at least one of cobalt oxide, nickel oxide, copper oxide, vanadium oxide, chromium oxide, and aluminates of said oxides, up to 40% by weight of $ZrO_2$, zirconium aluminate, or zirconium silicate, and impurity amounts of less that 1 mol.%, wherein said composition contains 20–40% by weight of at least one of $ZrO_2$, zirconium aluminate, and zirconium silicate.

2. A dielectric glass according to claim 1, wherein said composition has 15–20 mol.% ZnO, 10–15 mol.% PbO, 50–60 mol.% $SiO_2$, and 7.5–12.5 mol.% $Al_2O_3$.

3. A dielectric glass according to claim 1, wherein at least one of cobalt oxide, nickel oxide, copper oxide, vanadium oxide, chromium oxide, and aluminates of said oxides are present in said composition to provide color to said composition.

4. A glass ceramic dielectric comprising a dielectric glass having a composition consisting essentially of 10–25 mol.% ZnO, 7.5–25 mol.% PbO, 50–60 mol.% $SiO_2$, and 7.5–12.5 mol.% $Al_2O_3$ together with 0–5% by weight of at least one of cobalt oxide, nickel oxide, copper oxide, vanadium oxide, chromium oxide, and aluminates of said oxides, upto 40% by weight of $ZrO_2$, zirconium aluminate, or zirconium silicate, and impurity amounts of less than 1 mol.%; and a crystalline phase of said dielectric glass, said crystalline phase being in an amount between 10–20% by weight, wherein said composition contains 20–40% by weight of at least one of $ZrO_2$, zirconium aluminate, and zirconium silicate.

5. A glass ceramic dielectric according to claim 4, wherein said composition has 15–20 mol.% ZnO, 10–15 mol.% PbO, 50–60 mol.% $SiO_2$, and 7.5–12.5 mol.% $Al_2O_3$.

6. A glass ceramic dielectric according to claim 4, wherein at least one of cobalt oxide, nickel oxide, copper oxide, vanadium oxide, chromium oxide, and aluminates of said oxides are present in said composition to provide color to said composition.

7. A multilayer thick-film circuit comprising a surface layer; a layer having a conductor pattern on said surface layer; and a dielectric glass ceramic layer having apertures for electrical connections to separate crossing conductors of said conductor pattern, wherein said dielectric glass ceramic layer has a composition consisting essentially of 10–25 mol% ZnO, 7.5–25 mol.% PbO, 50–60 mol% $SiO_2$, and 7.5–12.5 mol.% $Al_2O_3$ together with 0–5% by weight of at least one of cobalt oxide, nickel oxide, copper oxide, vanadium oxide, chromium oxide, and aluminates of said oxides, upto 40% by weight of $ZrO_2$, zirconium aluminate, or zirconium silicate, and impurity amounts of less than 1 mol.%, said ceramic layer having a crystalline phase of said dielectric glass in an amount between 10–20% by weight, wherein said composition contains 20–40% by weight of at least one of $ZrO_2$, zirconium aluminate, and zirconium silicate.

8. A multilayer thick-film circuit according to claim 7, wherein said composition has 15–20 mol.% ZnO, 10–15 mol.% PbO, 50–60 mol.% $SiO_2$, and 7.5–12.5 mol.% $Al_2O_3$.

9. A multilayer thick-film circuit according to claim 7, wherein at least one of cobalt oxide, nickel oxide, copper oxide, vanadium oxide, chromium oxide, and aluminates of said oxides are present in said composition to provide color to said composition.

* * * * *